United States Patent
Baumann

(10) Patent No.: US 12,222,400 B2
(45) Date of Patent: Feb. 11, 2025

(54) STATE VALUE FOR RECHARGEABLE BATTERIES

(71) Applicant: TWAICE Technologies GmbH, Munich (DE)

(72) Inventor: Michael Baumann, Munich (DE)

(73) Assignee: TWAICE Technologies GmbH, Munich (DE)

( * ) Notice: Subject to any disclaimer, the term of this patent is extended or adjusted under 35 U.S.C. 154(b) by 324 days.

(21) Appl. No.: 17/761,768

(22) PCT Filed: Sep. 21, 2020

(86) PCT No.: PCT/DE2020/100813
§ 371 (c)(1),
(2) Date: Mar. 18, 2022

(87) PCT Pub. No.: WO2021/052540
PCT Pub. Date: Mar. 25, 2021

(65) Prior Publication Data
US 2022/0373609 A1    Nov. 24, 2022

(30) Foreign Application Priority Data
Sep. 20, 2019    (DE) .................. 10 2019 125 375.6

(51) Int. Cl.
| G01R 31/392 | (2019.01) |
| G01R 31/367 | (2019.01) |
| G01R 31/396 | (2019.01) |

(52) U.S. Cl.
CPC ......... G01R 31/392 (2019.01); G01R 31/367 (2019.01); G01R 31/396 (2019.01)

(58) Field of Classification Search
CPC ... G01R 31/392; G01R 31/367; G01R 31/396
USPC .......................................................... 702/63
See application file for complete search history.

(56) References Cited

U.S. PATENT DOCUMENTS

| 10,247,786 B2 | 4/2019 | La Marca et al. |
| 2013/0231826 A1 | 9/2013 | Zhang et al. |
| 2017/0120766 A1 | 5/2017 | Huber et al. |
| 2017/0242080 A1* | 8/2017 | La Marca ............ G01R 31/367 |
| 2018/0143257 A1* | 5/2018 | Garcia ................ G01R 31/382 |
| 2019/0199122 A1* | 6/2019 | Petit ........................ H02J 7/345 |

FOREIGN PATENT DOCUMENTS

| DE | 102014202622 A1 | 8/2015 |
| DE | 102016202572 A1 | 8/2017 |
| DE | 102017103348 A1 | 8/2018 |

(Continued)

OTHER PUBLICATIONS

Bernardi et al., "A General Energy Balance for Battery Systems", Journal of the Electrochemical Society, 1985, pp. 5-12, vol. 132:1.

(Continued)

*Primary Examiner* — Ricky Go
(74) *Attorney, Agent, or Firm* — The Webb Law Firm

(57) ABSTRACT

A state value for a rechargeable battery, for example a lithium-ion battery, is determined on the basis of several aging characteristic variables. The aging characteristic variables comprise at least one current aging value and one future aging value.

17 Claims, 7 Drawing Sheets

(56) References Cited

FOREIGN PATENT DOCUMENTS

WO  2015197483 A1  12/2015
WO  2020224724 A1  11/2020

OTHER PUBLICATIONS

Schmalstieg et al., "A holistic aging model for Li(NiMnCo)O2 based 18650 lithium-ion batteries", Journal of Power Sources, 2014, pp. 325-334, vol. 257.
Wu et al., "Heat dissipation design for lithium-ion batteries", Journal of Power Sources, 2002, pp. 160-166, vol. 109:1.

* cited by examiner

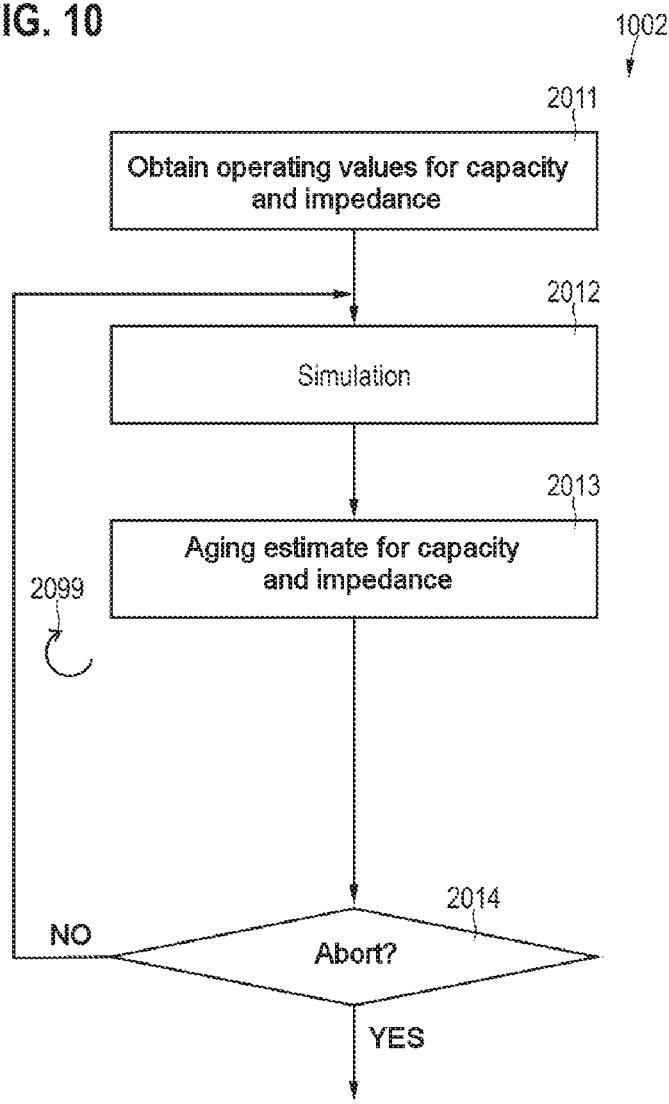

STATE VALUE FOR RECHARGEABLE BATTERIES

CROSS-REFERENCE TO RELATED APPLICATIONS

This application is the United States national phase of International Application No. PCT/DE2020/100813 filed Sep. 21, 2020, and claims priority to German Patent Application No. 10 2019 125 375.6 filed Sep. 20, 2019, the disclosures of which are hereby incorporated by reference in their entirety.

TECHNICAL FIELD

Various examples of the invention relate, in general, to techniques for characterizing a battery. In particular, various examples of the invention relate to techniques for determining a state value in connection with aging of a rechargeable battery.

BACKGROUND

Rechargeable batteries, for example traction batteries of electric vehicles, have a limited service life. For example, what is known as the state of health (SOH) of batteries may decrease over time, for example as a function of charging cycles. This can be problematic, for example, in terms of reliable operation of a corresponding battery-powered device. The SOH is typically determined in connection with the capacity and impedance of a battery.

It has been observed that it is sometimes only possible to determine the actual state of a rechargeable battery to a limited extent on the basis of the SOH alone.

BRIEF DESCRIPTION OF THE INVENTION

Therefore, there is a need for improved techniques for characterizing rechargeable batteries.

This object is achieved by the features of the independent patent claims. The features of the dependent patent claims define embodiments.

A method for ascertaining a state value in connection with aging of a rechargeable battery comprises ascertaining a current aging value of the battery. The method also comprises ascertaining a future aging value of the battery. An aging model is used for this purpose. Ascertaining the future aging value also takes into account the current aging value of the battery. The method also comprises ascertaining the state value of the battery, based on several aging characteristic variables. The several aging characteristic variables comprise, for example, the current aging value and/or the future aging value.

For example, the current aging value can be or comprise the SOH of the battery. The current aging value could comprise one or more performance characteristic variables of the battery, that is to say, for example, capacity or impedance etc. The SOH can describe, for example, the capacity or the impedance of the battery. For example, the SOH could be indicative of a decrease in the maximum capacity in comparison to the original state.

Since, in addition to the current aging value of the battery, the future aging value of the battery is also taken into account when ascertaining the state value of the battery, a reliable and comprehensive statement can be made about the actual state of the battery. Specifically, it is sometimes the case that an imminent significant decrease for instance in the SOH is not evident or not reliably evident from the current aging value alone. For example, situations have been observed in which the SOH of the battery decreases suddenly. In this case, the current aging value may be on the brink of such a sudden decrease: accordingly, the state of the battery is critical, but this may not be evident on the basis of the current aging value alone.

As a general rule, different implementations can be used for the future aging value of the battery. The future aging value can comprise one or more performance characteristic variables of the battery. The future aging value could describe, for example, the SOH of the battery for one or more future times. For example, it would be conceivable for the future aging value to comprise a calendric range of values of one or more performance characteristic variables of the battery. The calendric range of values can therefore specify the one or more performance characteristic variables as a function of the operating time and/or the charging time. However, as an alternative or in addition, it would also be conceivable for the future aging value to comprise a cycled range of values of the one or more performance characteristic variables of the battery. Such a cycled range of values corresponds to a specification of the one or more performance characteristic values as a function of charging and discharging cycles of the battery.

It would be possible, for example, for the method to further comprise: determining a distance from an end-of-life criterion of the battery. The distance can be expressed, for example, once again in a calendric and/or cycled manner, that is to say, for example, in operating hours and/or charging cycles. Determining the distance from the end-of-life criterion of this kind can be based on an analysis of the range of values. In this way, specifically, a signature of the one or more performance characteristic variables of the battery in the range of values can be ascertained, which signature corresponds to the end-of-life criterion. For example, the signature could comprise a sudden decrease in one or more performance characteristic variables. Such "bending" of a performance characteristic variable of the battery (for example a sudden decrease in the capacity) may be indicative of a sudden impairment in the state value of the battery. Such "bending" can correspond to non-linear degradation of the battery. Since such non-linear effects are taken into account in connection with the state value and, in particular, for example in connection with the prospective prediction of aging, the state of the battery can be estimated particularly reliably, in particular taking into consideration possible different application scenarios.

It would then be possible for the several aging characteristic variables, which are taken into account when ascertaining the state value of the battery, to comprise this distance from the end-of-life criterion.

However, other end-of-life criteria are also conceivable here. For example, it would be possible for the corresponding signature to comprise a decrease in at least one of the one or more performance characteristic variables to below a threshold value. Depending on the performance characteristic variable, overshooting of a threshold value could also be used as a signature. For example, the capacity could drop below a threshold value; and the impedance could rise above a threshold value.

As a general rule, various techniques would be conceivable for determining the threshold value. For example, the threshold value could be fixedly prespecified. However, the threshold value could also be determined dynamically. For example, the threshold value could be determined depending on an anticipated load profile of the battery within the scope of the method. This means that different threshold values could be used for different load profiles of the battery. This has the background that different load profiles are often associated with different application scenarios. Accordingly, it may be conceivable in connection with the threshold value for different decreases in the one or more performance characteristic variables of the battery to be acceptable for different application scenarios, without adversely affecting operation for which power is supplied by the battery. In addition, for example in the case of more conservative anticipated load profiles of the battery (that is to say for example lower power consumption per unit time, lower-level deep discharging, limited maximum charging etc.), a greater decrease in the one or more performance characteristic variables is able to be tolerated; and therefore a lower threshold value can be selected.

As a general rule, it would be conceivable in the various examples described here for a load profile (for instance an anticipated or else a historical load profile) of a battery to be expressed as a calendric and/or cycled range of values of one or more performance characteristic variables of the battery. However, as an alternative or in addition, it would also be possible for a load profile to be implemented in an event-related manner; that is to say one or more events is/are indicated, in the case of which one or more performance characteristic variables lie in at least one prespecified region. Such a prespecified region can correspond to particularly high, event-related loading of the battery. Therefore, it would be conceivable, for example, for the at least one prespecified region to be associated with irreversible lithium deposition on an electrode of the battery (lithium plating).

Different techniques are conceivable for ascertaining the anticipated load profile. In one example, the anticipated load profile could be determined based on the previous load, that is to say a historical load profile. However, the anticipated load profile could also be determined depending on a future application scenario of the battery.

In general, it would also be conceivable for the aging model to ascertain several future aging values based on several anticipated load profiles. In this case, the several anticipated load profiles can correspond to several application scenarios. The state value could then be determined, for example, taking into account the several anticipated aging values for the various load profiles. It would be possible, for example, to compare the several anticipated aging values with one another. For example, a variance in the anticipated aging values could be determined. For example, a worst-case estimation could be rendered possible in this way. For example, the worst-case situation could be taken into account to a particularly great extent when ascertaining the state value.

In a further example, the several anticipated load profiles and the associated several future aging values could also be associated with different application scenarios. Some application scenarios—and the anticipated load profiles linked to them—can have a lower load or a differently supported load (that is to say, for example, operation of the battery in other operating regions of the corresponding one or more performance characteristic variables, at lower temperatures etc.). In this way, the load of the battery can vary greatly depending on the application scenario. One or more suitable application scenarios could then be selected from the possible application scenarios for future operation. For example, that application scenario which is associated with the best future aging value, that is to say for example still has a long remaining service life until the end-of-life criterion, could be selected. The future aging value for this selected application scenario can then be critically taken into account when determining the state value.

As a general rule, an extremely wide variety of application scenarios are conceivable. A few examples are mentioned in the following: static energy store in a microgrid, for example in order to buffer-store solar energy; energy store for mobile applications, for example for light electric vehicles such as electric wheelchairs, electric bicycles etc., or for electric passenger cars; low-load energy stores, for example in connection with electronic consumer goods; indoor application; outdoor application; etc.

Depending on the application scenario, provision could also be made for the battery to be broken down into the different constituent parts, that is to say several battery cells. Such a technique may be desirable particularly when different battery cells have a different current aging value, for instance because they were loaded to different degrees during historical operation. In this connection, it would be conceivable for the current aging value, the future aging value and the state value which is ascertained based on the several aging characteristic variables to each be determined for each of several cells of the battery.

In this case, it would be possible for a specific application scenario to be selected from the several candidate application scenarios. This selection can be made depending on the state values which are associated with the different candidate application scenarios. The selection could also be made depending on the future aging values which are determined for the several candidate application scenarios. It would then be conceivable for the batteries to be installed in a device which is suitable for the respectively selected application scenario. Different battery cells could also be installed in different devices, that is to say supplied to different application scenarios. The latter may be particularly useful when the state value differs significantly for different battery cells.

For example, that application scenario which provides a maximum remaining service life, that is to say that application scenario which has a maximum distance from the end-of-life criterion, could be selected.

The method could further comprise: detecting historical load profiles of a battery ensemble. In this case, the battery ensemble can have a large number of batteries of the same type. It would then be conceivable for the anticipated load profile of the battery to be determined based on the historical load profiles of the battery ensemble. Such techniques are based on the finding that it would be conceivable for batteries of the same type and/or batteries in the same application scenario to typically be able to have comparable load profiles. Therefore, it may be possible to particularly accurately anticipate a load profile by way of the historical load profiles of the other batteries of the ensemble being taken into account Accordingly, it would also be conceivable for the aging module which is used to ascertain the state value to be calibrated based on information from the battery ensemble. For example, it would be possible for one or more parameter values of parameters of the aging model to be able to be determined correspondingly (parameterizing). For example, it would therefore be conceivable for the aging model to be parameterized based on calendric and/or cycled ranges of values of one or more performance characteristic variables of the batteries of the battery ensemble. A particularly accurate aging model can be obtained in this way. In addition, an inherent comparability between the state variables for different batteries of an ensemble can be achieved. This makes the state variable particularly reliable.

It would also be conceivable for a comparison of the load profiles of the respective battery to be carried out with an average load profile of the batteries of the battery ensemble. For example, it is possible to establish in this way whether specific aging mechanisms—for example rapid charging, low temperatures, particularly large depth of discharge—occur comparatively often or seldom in the respective battery. In this way, the aging of the battery in question can be estimated, for example by way of a comparison with the average load profile of the battery ensemble being carried out as part of the aging model.

In principle, it would be possible, in addition to the (instantaneous) current aging value and the future aging value, for the historical load profile of the battery to also be taken into account as a further characteristic variable when ascertaining the state value. This can be done—as described in general above—for example as a cycled or calendric range of values, and/or in an event-related manner, and/or in an aggregated manner.

As a general rule, it would be possible for the state value to be determined depending on one or more load profiles and/or aging values for batteries of the same type of a battery ensemble. For example, it would be possible to carry out a comparison between the aging value and/or the future aging value for the respective battery and a further aging value and/or a further future aging value for batteries of the same type of a battery ensemble. In this way, for example, the aging of the battery in question can be examined in comparison to aging of comparable batteries of the same type. In particular, it would be conceivable, for example, to select, from a battery ensemble containing batteries of the same type, those batteries which have a historical load profile which is comparable to the historical load profile of the battery to be assessed. As an alternative or in addition, it would be conceivable, for example, to select, from a battery ensemble containing batteries of the same type, those batteries which have a comparable amount of energy throughput. For example, in the case of batteries of a motor vehicle, those batteries which have provided energy for a comparable running performance of the motor vehicle could be selected. In this way, a check could be made as to whether the battery to be assessed has aged excessively, that is to say more than would be expected—given the respective aging profile. Such excessive aging can indicate that the distance from the end-of-life criterion for the respective battery will also occur comparatively soon.

Such techniques are based on the finding that the distance from the end-of-life criterion is not necessarily apparent only from the current aging value but can also be dependent on the load history of the battery and/or a relative relationship to comparable batteries of the same type can be assessed. In addition, certain harmful events which adversely affect the state of the battery can be mapped by the historical load profile.

Therefore, a multidimensional state value in respect of several different aging characteristic variables can be taken into account. For example, it would be conceivable for a comparison with a reference aging characteristic variable of batteries of the same type of a reference battery ensemble to be carried out for each of several aging characteristic variables. The state value could then be determined depending on this comparison.

As a general rule, it would be conceivable for the state value of the battery to be ascertained by combination of the several aging characteristic variables. This means that the information basis for ascertaining the state value has a high number of dimensions; and the state value is then expressed with a low number of dimensions. This can render it possible to detect the state of each individual battery rapidly and reliably on the basis of the single state value in the case of a large number of batteries. Automated subsequent applications can also employ a state value with a low number of dimensions.

In this case, the combination of the different aging characteristic variables for ascertaining the state value can be performed in extremely different ways. For example, a weighted combination could be performed, wherein combination weights are taken into account.

For example, it is conceivable (but not necessary) for these combination weights of the combination of the various aging characteristic variables to be ascertained based on the current aging value and/or the future aging value when ascertaining the state value. For the purpose of illustrating the following example: it would be conceivable, for example, for the current aging value to be taken into account to a greater extent for a hitherto still slightly aged, young battery than in the case of an already aged battery of advanced aging. Specifically, it may then be particularly important to also anticipate the aging in the future. Accordingly, the combination weight of the current aging value and the future aging value could be suitably adapted in such cases.

A computer program or a computer program product or a computer-readable storage medium comprises program code. The program code can be loaded and executed by a processor. When the program code is executed by the processor, this causes the processor to execute a method for ascertaining a state value. The state value is determined in connection with aging of a rechargeable battery. The method comprises ascertaining a current aging value of the battery; ascertaining a future aging value of the battery by means of an aging model and based on the current aging value; and ascertaining the state value of the battery based on several aging characteristic variables. The several aging characteristic variables comprise at least the current aging value and the future aging value.

An apparatus comprises a processor and a memory. The processor is designed to load program code from the memory and to execute it. When the processor executes the program code, this causes the processor to execute a method for ascertaining a state value in connection with aging of a rechargeable battery. This method comprises ascertaining a current aging value of the battery, and ascertaining a future aging value of the battery by means of an aging model and based on the current aging value; and ascertaining the state value of the battery based on several aging characteristic variables which comprise at least the current aging value and the future aging value.

The features presented above and features which are described below can be used not only in the corresponding explicitly presented combinations but also in further combinations or in isolation, without departing from the scope of protection of the present invention.

BRIEF DESCRIPTION OF THE FIGURES

FIG. 10 is a flowchart of an exemplary method.

DETAILED DESCRIPTION OF EMBODIMENTS

Figure 1:
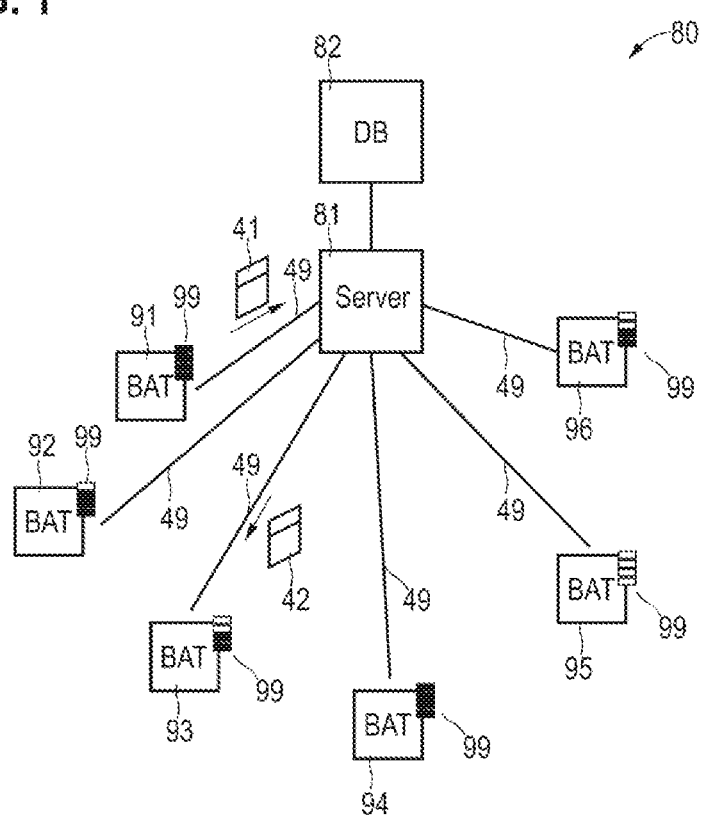
FIG. 1 schematically illustrates a system comprising several batteries and a server according to various examples.

The properties, features and advantages of this invention described above and the way in which they are achieved will become clearer and more clearly comprehensible in connection with the following description of the exemplary embodiments which are explained in greater detail in connection with the drawings.

The present invention is explained in greater detail below on the basis of preferred embodiments with reference to the drawings. In the figures, identical reference signs designate identical or similar elements. The figures are schematic representations of different embodiments of the invention. Elements illustrated in the figures are not necessarily depicted as true to scale. Rather, the various elements illustrated in the figures are reproduced in such a way that their function and general purpose become comprehensible to the person skilled in the art. Connections and couplings between functional units and elements as illustrated in the figures may also be implemented as an indirect connection or coupling. A connection or coupling may be implemented in a wired or wireless manner. Functional units may be implemented as hardware, software or a combination of hardware and software.

Techniques relating to the characterization of rechargeable batteries are described below. The techniques described herein can be used in connection with an extremely wide range of different types of battery, for example in connection with lithium-ion-based batteries, such as lithium-nickel-manganese-cobalt oxide batteries or lithium-manganese-oxide batteries.

The batteries described herein can be used for batteries in various application scenarios, for example for batteries which are used in devices such as motor vehicles or drones or portable electronic devices such as mobile radio devices for instance. It would also be conceivable to use the batteries described herein in the form of static energy storage devices. Interior or exterior applications are conceivable, these differing primarily in respect of the temperature ranges. Application scenarios comprise: static energy store in a microgrid; energy store for mobile applications: low-load energy stores; energy store for light electric vehicles; energy store for electric passenger cars; interior application; and exterior application.

The techniques described herein render it possible to ascertain a state value of the battery in connection with the characterization of the battery. The state value correlates with the aging of the rechargeable battery. The state value can describe the quality of the battery (and could therefore also be called the Q value).

According to various examples described herein, several aging characteristic variables of the battery are taken into account when ascertaining the state value. In particular, a current aging value of the battery and a future aging value of the battery can be taken into account. The future aging value can be obtained by means of an aging model. This corresponds to a prediction of performance characteristic variables of the battery. One or more performance characteristic variables can be anticipated for a certain prediction interval. Yet further or other aging characteristic variables could also be taken into account, for example a historical load profile or a historical aging value which is derived therefrom.

As a general rule, for example, a combination of the several aging characteristic variables could be performed, for example a weighted combination. Depending on the influence of the respective aging characteristic variable, this can be taken into account to a greater or lesser extent.

Such techniques are based on the finding that, for example, lithium-ion batteries or other rechargeable batteries can age both due to use (cyclic aging) and also due to storage (calendric aging). The aging is reflected in the form of a loss in capacity and an increase in impedance. This is typically detected using the SOH. However, here, the aging depends on many factors, for example stress factors such as temperature, state of charge, depth of discharge, current rate during discharging and charging etc. The aging can further take place due to different aging mechanisms, for example solid electrolyte interface (SEI) layer growth or lithium deposition (lithium plating).

It has been found that the aging mechanisms that had occurred during previous operation can also influence the future further course of aging. For example, lithium deposition that has already occurred promotes further continued lithium deposition in the future and therefore (even) faster loss of capacity given an otherwise unchanged load profile.

As a result of such conditions, it is often not possible or possible only to a limited extent to assess the state of the battery and therefore the remaining service life on the basis of a single, current aging value. Therefore, for example, the remaining value of the battery cannot be determined or can be determined only inaccurately. The suitability for further application scenarios, for example a second-life application of the battery, also cannot be determined or can be determined only inaccurately on the basis of the current aging value.

Using the techniques described herein, it is possible to make a well-founded statement about the state of the battery. The state value of the battery is ascertained based on several aging characteristic variables. In this way, for example, a factor having a small number of dimensions can be obtained, which renders possible simple quantification and monitoring of processes which are dependent on the battery. What is known as a load index or quality index could be created.

The state value could be used to check for proper use of the battery. For example, warranty cases could be discovered or regulated. This may take place, for example, by way of the state values of a large number of batteries of an ensemble being compared with one another. If a deviation in the state value from the other state values is identified within the scope of such a comparison, a warning could be output. The comparison can be performed quickly and robustly by way of the state value with a small number of dimensions being compared.

FIG. 1 illustrates aspects in connection with a system 80. The system 80 comprises a server 81 which is connected to a database 82. In addition, the system 80 comprises communication connections 49 between the server 81 and each of several batteries 91-96. The communication connections 49 could be implemented, for example, via a mobile radio network. For example, the batteries 91-96 can form an ensemble, that is to say can all be of the same type.

FIG. 1 illustrates, by way of example, that the batteries 91-96 can send state data 41 to the server 81 via the communication connections 49. For example, it would be possible for the state data 41 to be indicative of a historical load profile, for example an event-related load profile and/or a collective load profile, of the respective battery 91-96 or indicative of corresponding performance variables. An exemplary performance variable is the SOH of the respective battery 91-96; this is determined based on or corresponds to the capacity of the respective battery 91-96 and/or the impedance of the respective battery 91-96. The SOH serves as an aging value of the battery. Further examples of performance characteristic variables are a charging or discharging rate, temperature, depth of discharge etc.

FIG. 1 also illustrates, by way of example, that the server 81 can send control data 42 to the batteries 91-96 via the communication connections 49. For example, it would be possible for the control data 42 to indicate one or more operating limits for the future operation of the respective battery 91-96. For example, the control data could indicate one or more control parameters for thermal management of the respective battery 91-96 and/or charge management of the respective battery 91-96. Using the control data 42, the server 81 can therefore influence or control the operation of the batteries 91-96. This could be done, for example, based on a state value which is ascertained by the server 81 for the respective battery.

FIG. 1 also schematically illustrates a respective state value 99 for each of the batteries 91-96. Techniques for ascertaining the state value 99 are described below.

Figure 2:
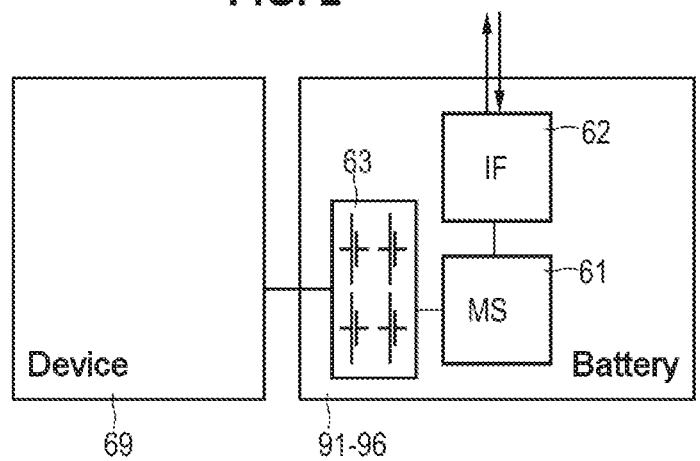
FIG. 2 illustrates details of a battery according to various examples.

FIG. 2 illustrates aspects relating to the batteries 91-96. The batteries 91-96 are coupled to a respective device 69. This device is powered by electrical energy from the respective battery 91-96.

The batteries 91-96 comprise or are associated with one or more management systems 61, for example a BMS or another control logic system such as an on-board unit in the case of a vehicle. The management system 61 can be implemented, for example, by software on a CPU. As an alternative or in addition, for example, an application-specific circuit (ASIC) or a field-programmable gated array (FPGA) could be used. The batteries 91-96 could communicate with the management system 61 via a bus system, for example. The batteries 91-96 also comprise a communication interface 62. The management system 61 can establish a communication connection 49 with the server 81 via the communication interface 62.

While the management system 61 is drawn separately from the batteries 91-96 in FIG. 2, in other examples it would also be possible for the management system 61 to form part of the batteries 91-96.

In addition, the batteries 91-96 comprise one or more battery blocks 63. Each battery block 63 typically comprises a number of battery cells connected in parallel and/or connected in series. Electrical energy can be stored there.

Typically, the management system 61 can employ one or more sensors in the one or more battery blocks 63. The sensors can measure, for example, performance characteristic variables of the respective battery, for instance the current flow and/or voltage in at least some of the battery cells. As an alternative or in addition, the sensors can also measure other performance characteristic variables in connection with at least some of the battery cells, for example temperature, volume, pressure etc. The management system 61 can then be designed to determine a current SOH for the respective battery 91-96 or optionally also for individual battery blocks on the basis of one or more such measured values from sensors, that is to say, for example, to determine the electrical capacity and/or the electrical impedance of the battery and to send them/it to the server 81 in the form of operating data. All such variables are called performance variables.

Figure 3:
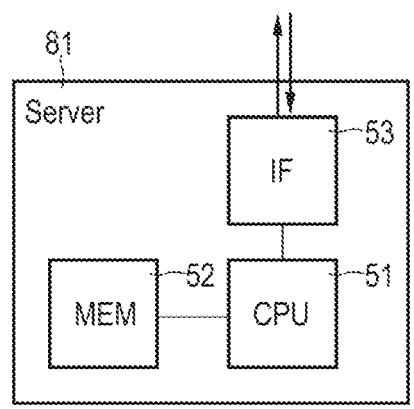
FIG. 3 illustrates details of a server according to various examples.

FIG. 3 illustrates aspects in connection with the server 81. The server 81 comprises a processor 51 and a memory 52. The memory 52 can comprise a volatile storage element and/or a non-volatile storage element. In addition, the server 81 also comprises a communication interface 53. The processor 51 can establish a communication connection 49 with each of the batteries 91-96 and the database 82 via the communication interface 53.

For example, program code can be stored in the memory 52 and loaded by the processor 51. The processor 51 can then execute the program code. Executing the program code causes the processor 51 to execute one or more of the following processes, as described in detail in connection with the various examples in this document: characterizing batteries 91-96; ascertaining a state value 99 for the batteries 91-96; ascertaining aging values for the batteries 91-96; applying an aging model; for example with one or more simulations; carrying out electrical simulation of batteries 91-96 in connection with the aging model; carrying out thermal simulation of batteries 91-96 in connection with the aging model; sending control data to batteries 91-96, for example to set operating boundary conditions; storing a result of a characterization of a corresponding battery 91-96 in a database 82; etc.

Figure 4:
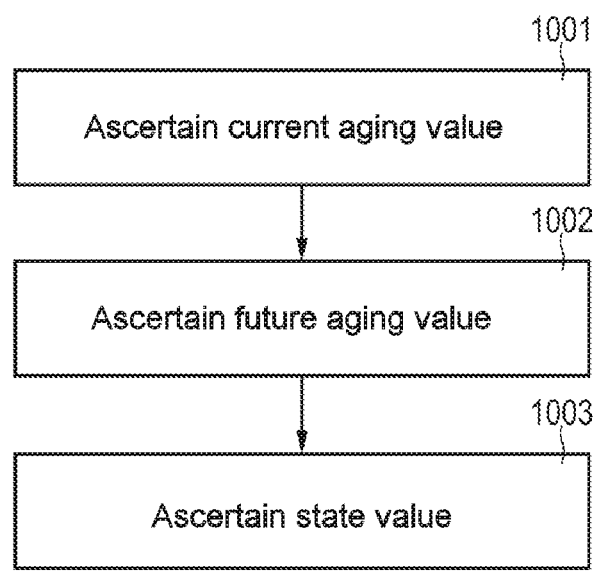
FIG. 4 is a flowchart of an exemplary method.

FIG. 4 is a flowchart of an exemplary method. The method is executed by a server. The method serves for server-side characterization of a battery. For example, it would be possible for the method according to FIG. 4 to be executed by the processor 51 of the server 81 based on the program code from the memory 52 (cf. FIG. 3).

Firstly, in block 1001, a current aging value of the battery is ascertained. For example, state data 41 could be received from the respective battery 91-96 for this purpose (cf. FIG. 1). For example, the current aging value could correspond to the SOH. It would be possible for the SOH to already be received in the form of the state data 41 from the respective battery 91-96, or else to be derived from one or more other performance characteristic variables of the respective battery 91-96.

Then, in block 1002, a future aging value of the respective battery is ascertained. An aging model is used for this purpose.

As a general rule, the aging model can comprise thermal and electrical simulation. The future aging value can further also be determined based on the current aging value from block 1001.

Finally, in block 1003, a state value of the battery is ascertained. This is performed based on the current aging value from block 1001 and on the future aging value from block 1002. However, for example, as an alternative or in addition to such aging characteristic variables, further aging characteristic variables could also be taken into account when ascertaining the state value in block 1003.

The state value can therefore comprise a combination of several aging characteristic variables. The state value can therefore comprise, for example, a combination of the current aging value and the future aging value. In this way, the state value can particularly meaningfully and accurately reflect the state of the battery. A corresponding motivation is illustrated in connection with FIG. 5.

Figure 5:
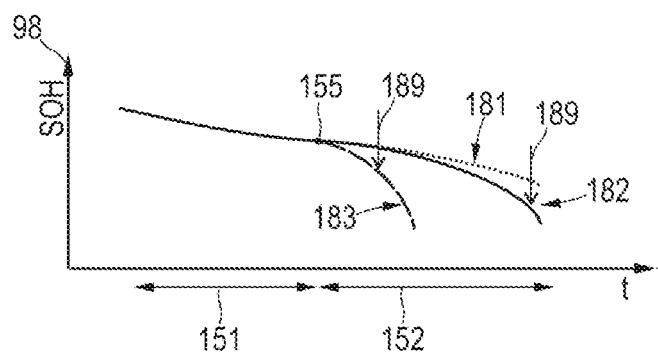
FIG. 5 schematically illustrates a future aging value of a battery according to various examples.

FIG. 5 illustrates aspects in connection with the characterization of the state of the battery. FIG. 5 illustrates an aging value 98 of the battery—here the SOH—as a function of time, for example the operating time. However, a comparable scenario would also be produced taking into consideration the aging value 98 as a function of the charging and discharging cycles (cycled aging). The historical operating interval 151 and a future operating interval 152 in operation of the respective battery 91-96 are also shown in FIG. 5.

FIG. 5 illustrates that the SOH 98 decreases as a function of time. The SOH 98 at the ACTUAL time 155 is marked in FIG. 5 (current aging value).

FIG. 5 also illustrates three paths 181-183 for the future aging value 98 in the prediction interval 152. FIG. 5 shows that a corresponding range of values of the future aging value 98 of the various paths 181-183 exhibits a sudden decrease in each case (identified by the vertical arrows for the paths 182-183 in FIG. 5). This sudden decrease is the signature of an end-of-life criterion 189.

FIG. 5 shows that the remaining service life as the distance between the ACTUAL time 155 and the end-of-life criterion 189 is different depending on the path 181-183. This can be taken into account in the various techniques described herein by way of the future aging value—that is to say for example a range of values of the SOH 98 as illustrated in FIG. 5 or in general a calendric and/or cycled range of values of one or more performance characteristic variables of the respective battery 91-96—being taken into account when ascertaining the state value 99 of the battery. In particular, the remaining service life as the distance from the end-of-life criterion 189 could be taken into account when ascertaining the state value, for instance by way of an analysis of the respective range of values being carried out for ascertaining the corresponding signature.

Figure 6:
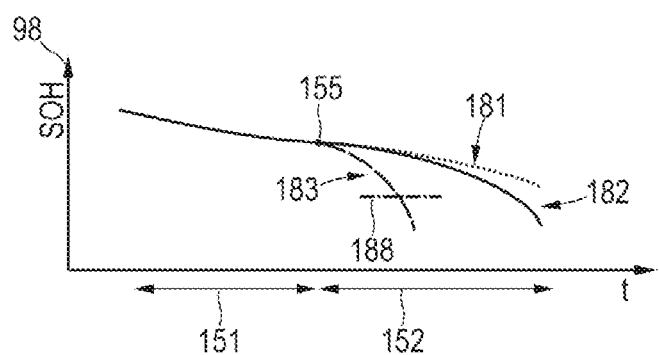
FIG. 6 schematically illustrates a future aging value of a battery according to various examples.

While the end-of-life criterion 189 has been discussed in connection with the sudden decrease in the SOH 98 in connection with FIG. 5, other end-of-life criteria are also conceivable in general. For example, a corresponding signature could comprise the decrease in the capacity as a corresponding power characteristic variable to below a prespecified threshold value. This is illustrated for a threshold value 188 in FIG. 6.

The various paths 181-183 can result from taking into account different load profiles. As a general rule, the load profiles can specify how often and/or to what extent the battery is loaded. For example, the load profile of the respective battery 91-96 could determine specific boundary conditions for the performance characteristic variables of the battery, that is to say for example specify how often strong deep discharge occurs, what an average state of charge of the battery is, at which ambient temperature the battery is operated etc. As a general rule, a historical load profile can be used for the historical interval 151 and an anticipated load profile can be used for the prediction interval.

Figure 7:
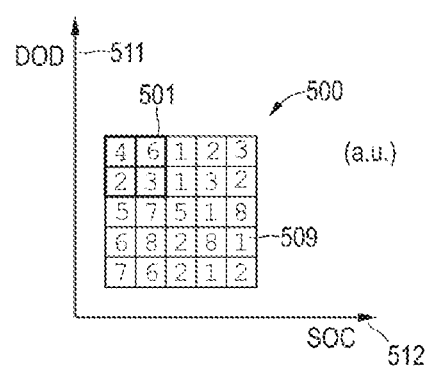
FIG. 7 illustrates an aggregated load profile of a battery according to various examples.

A corresponding example of a load profile 500 is illustrated in FIG. 7.

FIG. 7 illustrates aspects in connection with a load profile 500. For example, the load profile 500 could be a historical load profile during the historical time interval 151 (compare FIG. 5 and FIG. 6). However, it would also be possible for the load profile 500 to be an anticipated load profile during the prediction interval 152.

FIG. 7 illustrates an aggregated load profile 500. This means that the frequency 509 of specific performance characteristic variables, in FIG. 7 depth of discharge 511 (DOD) and state of charge 512 (SOC), is specified. In the example of FIG. 7, the load profile 500 also illustrates a prespecified region 501, for particularly large depths of discharge 511 at low SOC 512 (other prespecified regions would also be conceivable). The load profile 500 indicates, in particular, the frequency of operation of the respective battery in the prespecified region. For example, it would be conceivable for the prespecified region to be associated with irreversible lithium deposition on an electrode of the battery.

In addition to such an aggregated load profile 500, other implementations are also conceivable for the load profile. A corresponding example is illustrated in FIG. 8.

Figure 8:
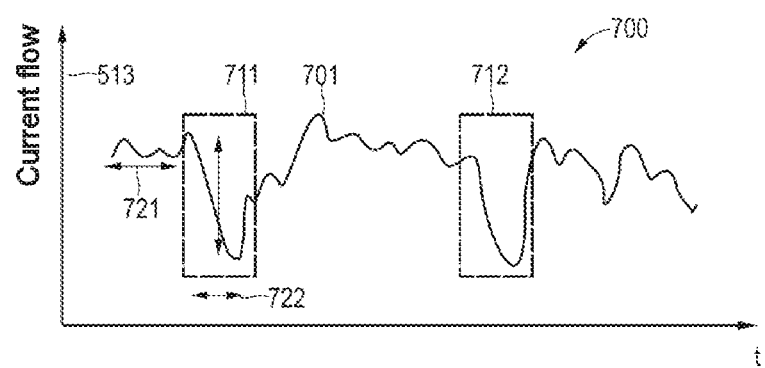
FIG. 8 schematically illustrates an event-based load profile of a battery according to various examples.

FIG. 8 illustrates aspects in connection with a load profile 700. In FIG. 8, the current flow 513 is illustrated as a performance characteristic variable of the respective battery as a function of time. In particular, FIG. 8 illustrates a load profile 700 which comprises a corresponding range of values 701.

In addition, FIG. 8 illustrates that it may be possible to use an event-based load profile. For example, it would be possible to define the events 711, specifically a sudden decrease in the current flow 513 during a time interval 722, following a time interval 721 with a relatively constant current flow 513. For example, the frequency of such events 711-712 could be counted as part of an event-based load profile.

Such load profiles 500, 700 can be taken into account in the techniques described herein in an extremely wide variety of ways.

As a first example, such a historical load profile 500, 700 could be taken into account—during the historical interval 151—as an aging characteristic variable when ascertaining the state value 99.

As a second example, the historical load profile 500, 700 could be taken into account during the prediction interval 152 when ascertaining an anticipated load profile 500, 700.

As a third example, it would be possible to detect historical load profiles of batteries of a battery ensemble and then to determine the anticipated load profile of the respective battery based on these historical load profiles.

As a fourth example, the aging model could be executed using a corresponding anticipated load profile 500, 700. In other words, this therefore means that the anticipated load profile is taken into account when ascertaining the future aging value (cf. FIG. 4: block 1002). In this case, the anticipated load profile could be determined, for example, depending on an historical load profile 500, 700 and/or on load profiles of other batteries 91-96 of a battery ensemble.

A fifth example for taking into account a load profile would be that the end-of-life criterion is defined in connection with the anticipated load profile. For example, the threshold value 188 (cf. FIG. 6) or the bending signature 189 could be determined depending on the anticipated load profile of the battery.

Figure 9:
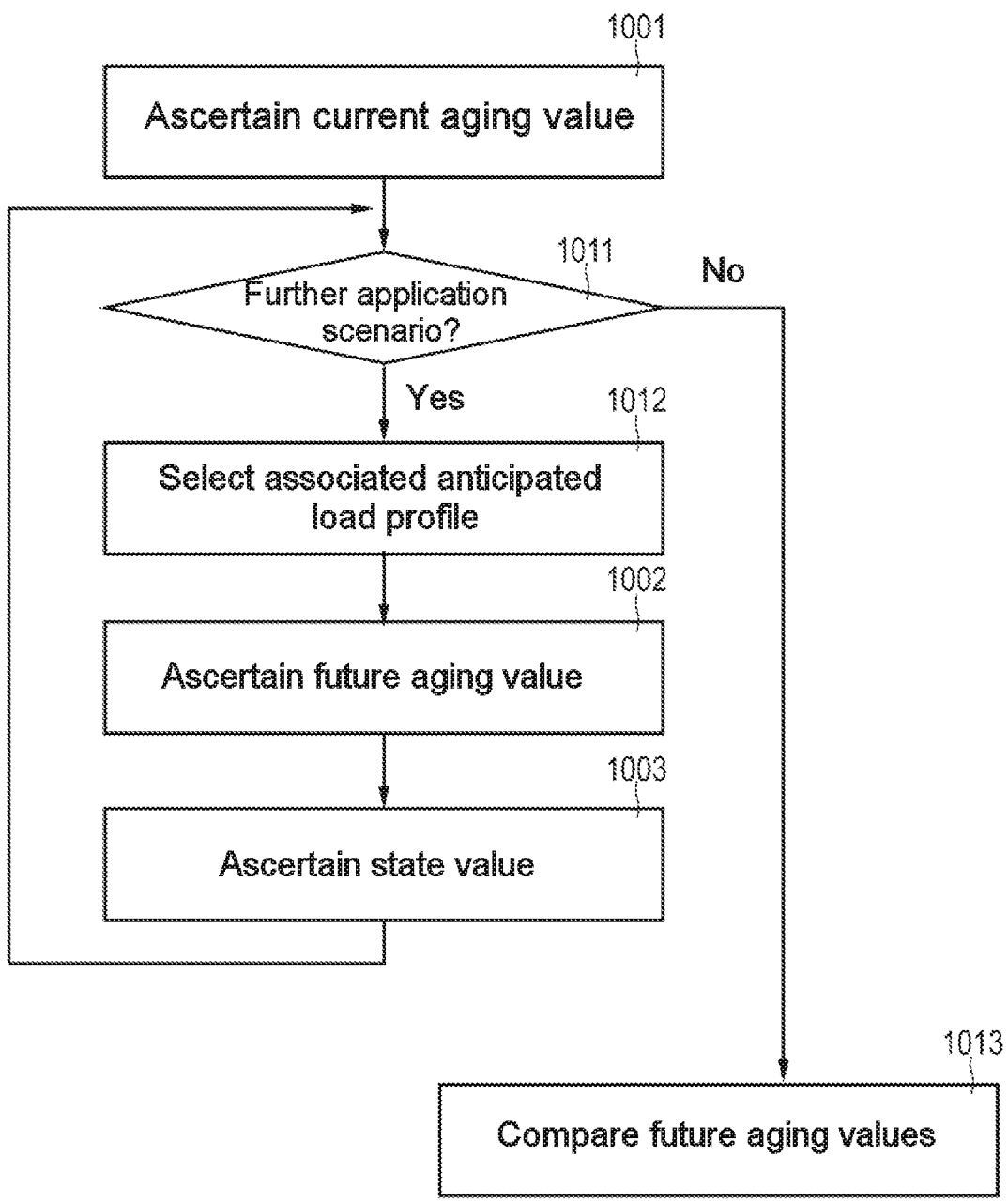
FIG. 9 is a flowchart of an exemplary method.

Yet a further example for taking into account a load profile is illustrated in FIG. 9. FIG. 9 is a flowchart of an exemplary method. The method from FIG. 9 corresponds, in principle, to the method from FIG. 4. Here, the method from FIG. 4 has been modified to the effect that several iterations of blocks 1002 and 1003 are carried out, that is to say several future aging values are ascertained and also, based on the several future aging values from the various iterations of block 1002, several state values are also ascertained in the iterations of block 1003.

The associated anticipated load profile 500, 700 is varied from iteration to iteration by way of block 1012 being executed. The various anticipated load profiles 500, 700 selected in the several iterations of block 1012 are correlated with various application scenarios in the prediction interval 152 here. Typically, different application scenarios specifically have different load profiles. There are less load-producing application scenarios, for example for static energy stores in a microgrid; and there are also particularly load-producing application scenarios, for example energy stores for electric passenger cars. The various application scenarios are each queried and selected in block 1011.

It would then be possible in block 1013 to compare the various future aging values from the iterations of block 1002 with one another. It would then be possible to select one or more future aging values based on this comparison and to take them into account when ascertaining the state value 99. For example, in a worst-case consideration, the worst future aging value could be taken into account, that is to say that future aging value which corresponds to the most rapid/most severe aging. However, an average value of the various future aging values or a variance could also be taken into account.

The implementation of the aging model is described below, specifically with reference to the flowchart in FIG. 10.

FIG. 10 illustrates a flowchart of an exemplary method. The method according to FIG. 10 can be executed by a server. For example, it would be possible for the method according to FIG. 10 to be executed by the processor 51 of the server 81 based on program code from the memory 52 (see FIG. 3).

The method according to FIG. 10 serves to ascertain the future aging value of the battery by means of the aging model. If several future aging values are intended to be predicted (cf. FIG. 9), the method according to FIG. 10 is carried out several times.

In block 2011, the operating values for the capacity and the impedance of the respective battery are obtained first. This means that a current value for the SOH of the battery is obtained. This is typically done based on state data which is received from the respective management system which is associated with the corresponding battery. These operating values serve to initialize the state prediction.

Then, several iterations 2099 of blocks 2012-2014 are carried out. In this case, the various iterations 2099 correspond to time steps for the state prediction, that is to say advancing time during the prediction interval 152.

In this case, firstly, the simulation of an electrical state of the battery and a thermal state of the battery takes place in block 2012 by means of corresponding simulation modules for the respective time step of the corresponding iteration 2099.

In block 2012, the simulation takes place taking into account the corresponding anticipated load profile 500, 700 of the battery.

An electrical simulation module can be coupled to a thermal simulation module in order to simulate the electrical and thermal state.

The electrical simulation module can use an equivalent circuit model (ECM) for the battery. The ECM can comprise electrical components (resistor, inductor, capacitor). The parameters of the components of the ECM can be determined, for example, on the basis of a Nyquist plot with the characteristic frequency ranges of the transfer function of the cell block of the battery. Owing to the implementation on the server 81, the number of RC elements can be selected to be particularly large, for example greater than three or four. This enables a particularly high degree of accuracy of the electrical simulation to be achieved. In this case, one ECM can be used for each cell of a cell block. In this case, the ECM is merely an example and other implementations are also possible, for example an electrochemical model.

The thermal simulation model enables the time-temperature curve and optionally the local temperature to be determined. Heat sources and heat sinks can be taken into account here. The heat dissipation to the environment can be taken into account. Details relating to the heat generation model are described, for example, in: D. Bernandi, E. Pawlikowski, and J. Newman, "A General Energy Balance for Battery Systems," Journal of the Electrochemical Society, 1985. Analytical or numerical models for the local temperature distribution can be used. The influence of a thermal management system can be taken into account. See, for example, M.-S. Wu, K. H. Liu, Y.-Y. Wang and C.-C. Wan, "Heat dissipation design for lithium-ion batteries," Journal of Power Sources, vol. 109, no. 1, pp. 160-166, 2002.

Based on this, an aging estimation is then carried out in block 2013, that is to say the capacity and the impedance of the battery are determined for the respective time step based on a result of the simulation of the electrical state and of the thermal state of the battery.

Different techniques can be used in connection with the aging estimation. The aging estimation can comprise, for example, an empirical aging model equation and/or a machine-learning aging model equation. For example, an empirical aging model equation and a machine-learning aging model equation could be applied in parallel and then results of these two aging model equations could be combined by averaging, for example weighted averaging.

As a general rule, the empirical aging model equation could comprise one or more empirically determined parameters which relate the anticipated load profile to a deterioration in the SOH, for example a reduction in the capacity and/or an increase in the impedance. The parameters can be determined in laboratory tests, for example. An exemplary empirical aging model is described in: J. Schmalstieg, S. Kabitz, M. Ecker and D. U. Sauer, "A holistic aging model for Li(NiMnCo)O2 based 18650 lithium-ion batteries," Journal of Power Sources, vol. 257, pp. 325-334, 2014. It would also be possible to parameterize the empirical aging model equation by way of employing calendric and/or cycled ranges of values of corresponding aging characteristic variables of the battery in the historical interval 151.

A machine-learning aging model equation can be continuously adapted based on state data, which is obtained from different batteries of the same type, using machine learning. Such ranges of values could also be taken into account here. For example, artificial neural networks, such as convolutional neural networks, could be used. Another technique comprises what is known as the support vector machine method. For example, data from an ensemble of batteries (compare FIG. 1: batteries 91-96) can be used in order to train a corresponding algorithm using machine learning.

Then, in block 2014, a check is made as to whether an abort criterion is met. If this is not the case, block 2012 is executed once again for a next time step in the prediction interval 152, that is to say for the next iteration 2099. The capacities and impedances determined in the previous iteration 2099 are used here, that is to say the simulations in block 2012 build on one another. This iterative adaptation of capacity and impedance allows a particularly accurate state prediction.

If the abort criterion in block 2014 is met, the future aging value can be ascertained. Examples of abort criteria include: number of iterations 2099; end of the prediction interval 152 reached; overshooting or undershooting of capacity and/or impedance threshold values; reaching of an end-of-life criterion; etc.

In summary, techniques for characterizing a battery have been determined above. In this case, a state value is determined based on several aging characteristic variables. In particular, a future aging value of the battery can also be taken into account as an aging characteristic variable.

Particularly accurate assessment of the remaining value of batteries for their respective application scenario can be performed by means of such techniques. It is possible to select a suitable future application scenario, for example a second-life application scenario. The state of several batteries can be compared with one another. Warranty cases can be identified. For example, it would be possible for different application scenarios, from which the future application scenario is selected, to differ in respect of a consumer which obtains the energy from the battery. The various application scenarios can differ in respect of the load profile. For example, the battery could be installed in different devices. For example, it would be conceivable for the battery and/or battery cells of the battery to be installed in different devices depending on the selection. In this case, different application scenarios can be associated with different devices. For example, a device for a "microgrid" application scenario could be associated with an energy buffer store device for the stationary mounting. The "energy store for light electric vehicles" application scenario could be associated, for example, with an electric wheelchair or hoverboard.

A further example of an application scenario-specific device includes large stores for primary power or secondary power or peak shaving. A large store can be used for storing regeneratively produced electrical energy, for instance from photovoltaic systems. Typically, relatively low charging and/or discharging power levels occur there, therefore operation is comparatively gentle in comparison to automotive application for example.

It goes without saying that the features of the embodiments and aspects of the invention described above can be combined with each other. In particular, the features can be used not only in the described combinations, but also in other combinations or in isolation, without departing from the scope of the invention.

For example, various techniques have been described above in connection with ascertaining a state value of a battery. Such techniques can also be implemented for individual blocks of the battery or cells or cell groups of the battery. This means the individual values or variables, as described above, can also be determined individually for individual cells or cell groups in each case.

For example, various techniques have been described in connection with ascertaining the state value of the battery. These techniques have been described in a context in which the state value is ascertained depending on the current aging value and on the future aging value. However, in general, it would be conceivable here for only one of the two aging values to be taken into account or else for entirely different aging characteristic variables to be taken into account when ascertaining the state value.

The invention claimed is:

1. A method for ascertaining a state value in connection with aging of a rechargeable battery, where the method comprises:
    ascertaining a current aging value of the battery,
    ascertaining a future aging value of the battery by means of an aging model and based on the current aging value,
    ascertaining the state value of the battery based on several aging characteristic variables which comprise at least the current aging value and the future aging value,
    selecting a specific application scenario depending on a comparison of several future aging values, and
    installing the battery or at least one cell of the battery into a device which is selected depending on the selection of the specific application scenario, where different application scenarios are associated with different devices.

2. The method as claimed in claim 1,
    wherein the future aging value comprises a calendric and/or cyclic range of values of one or more performance characteristic variables of the battery,
    where the method further comprises:
        determining a distance from an end-of-life criterion of the battery, based on an analysis of the range of values for identifying a signature of the one or more performance characteristic variables of the battery, which signature corresponds to the end-of-life criterion,
    wherein the several aging characteristic variables comprise the distance from the end-of-life criterion.

3. The method as claimed in claim 2,
    where the signature comprises a sudden decrease in at least one of the one or more performance characteristic variables.

4. The method as claimed in claim 2,
    where the signature comprises a decrease in or overshooting of at least one of the one or more performance characteristic variables to below or above a threshold value,
    where the method further comprises:
        determining the threshold value depending on an anticipated load profile or an anticipated application scenario of the battery.

5. The method as claimed in claim 1, where the method further comprises:
    detecting a historical load profile of the battery, and
    determining an anticipated load profile of the battery based on the historical load profile of the battery,
    wherein the aging model predicts the future aging value based on the anticipated load profile.

6. The method as claimed in claim 1,
    where the aging model ascertains several future aging values based on several anticipated load profiles,
    wherein the several anticipated load profiles correspond to several application scenarios,
    where the several application scenarios are selected from the following group: static energy store in a microgrid; energy store for mobile applications; low-load energy store; energy store for light electric vehicles; energy store for electric passenger cars; indoor application; and outdoor application.

7. The method as claimed in claim 6,
    where the current aging value, the future aging value and the state value are each determined for each of several battery cells of the battery,
    where different application scenarios are taken into consideration for different battery cells.

8. The method as claimed in claim 6, where the method further comprises:
    selecting one or more future aging values as aging characteristic variables for ascertaining the state value based on a comparison of the several future aging values.

9. The method as claimed in claim 1, where the method further comprises:
    detecting historical load profiles of a battery ensemble with a large number of batteries of the same type and/or batteries in the same application scenario, and determining an anticipated load profile of the battery based on the historical load profiles of the battery ensemble.

10. The method as claimed in claim 9, which further comprises:
parameterizing the aging model based on calendric and/or cycled ranges of values of one or more performance characteristic variables of the batteries of the battery ensemble.

11. The method as claimed in claim 1, which further comprises:
detecting a historical load profile of the battery,
wherein the aging characteristic variables further comprise the historical load profile of the battery.

12. The method as claimed in claim 11,
wherein the historical load profile of the battery comprises calendric and/or cycled ranges of values of one or more performance characteristic variables of the batteries, and/or
wherein the historical load profile of the battery indicates events in the case of which one or more performance characteristic variables lie in at least one prespecified region, and/or
wherein the historical load profile of the battery comprises aggregated performance characteristic variables of the battery.

13. The method as claimed in claim 12,
where the at least one prespecified region is associated with irreversible lithium deposition on an electrode of the battery.

14. The method as claimed in claim 1,
where the state value is ascertained based on a combination of the several aging characteristic variables,
where the method further comprises:
determining combination weights of the combination based on the current aging value and the future aging value.

15. The method as claimed in claim 1, where the method further comprises:
comparing the state value with a large number of reference state values of further batteries of the same type, and
emitting a warning depending on the comparison.

16. An apparatus comprising a processor and a memory, where the processor is designed to load program code from the memory and to execute it, where executing the program code causes the processor to execute:
ascertaining a current aging value of the battery,
ascertaining a future aging value of the battery by means of an aging model and based on the current aging value,
ascertaining a state value of the battery based on several aging characteristic variables which comprise at least the current aging value and the future aging value,
selecting a specific application scenario from several application scenarios depending on a comparison of several future aging values, and
selecting a device into which the battery is to be installed, the selection depending on the selection of the specific application scenario, where different application scenarios are associated with different devices.

17. A method for ascertaining a state value in connection with aging of a rechargeable battery, where the method comprises:
ascertaining a current aging value of the battery,
ascertaining a future aging value of the battery by means of an aging model and based on the current aging value, and
ascertaining the state value of the battery based on several aging characteristic variables which comprise at least the current aging value and the future aging value,
selecting a specific application scenario from the several application scenarios depending on a comparison of the several future aging values, and
installing the battery or at least one cell of the battery into a device which is selected depending on the selection of the specific application scenario, where different application scenarios are associated with different devices,
wherein the aging model ascertains several future aging values based on several anticipated load profiles,
wherein the several anticipated load profiles correspond to several application scenarios, and
where the several application scenarios are selected from the following group: static energy store in a microgrid; energy store for mobile applications; low-load energy store; energy store for light electric vehicles; energy store for electric passenger cars; indoor application; and outdoor application.

* * * * *